(12) United States Patent
Tsukamoto (10) Patent No.: US 7,776,225 B2
(45) Date of Patent: Aug. 17, 2010

(54) METHOD FOR FORMING ON-CHIP LENS INCLUDING PROCESS OF FORMING DEPRESSION BY USING ETCH-BACK METHOD, AND METHOD FOR MANUFACTURING SOLID-STATE IMAGING APPARATUS INCLUDING PROCESS OF FORMING IN-LAYER MICRO LENS USING THE METHOD FOR FORMING ON-CHIP LENS

(75) Inventor: Akira Tsukamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 797 days.

(21) Appl. No.: 11/727,651

(22) Filed: Mar. 27, 2007

(65) Prior Publication Data

US 2008/0035604 A1 Feb. 14, 2008

(30) Foreign Application Priority Data

Mar. 27, 2006 (JP) .............................. 2006-085739

(51) Int. Cl.
*B29D 11/00* (2006.01)
(52) U.S. Cl. ................. 216/26; 257/E27.156
(58) Field of Classification Search ................. None
See application file for complete search history.

(56) References Cited

U.S. PATENT DOCUMENTS

| 6,015,976 | A  | * | 1/2000 | Hatakeyama et al. | .. 250/492.23 |
| 6,952,074 | B2 | * | 10/2005 | Nagaura | ...................... 310/361 |
| 2001/0036602 | A1 | * | 11/2001 | McGrew et al. | ............. 430/321 |
| 2002/0122255 | A1 | * | 9/2002 | Ogusu et al. | ................. 359/566 |
| 2002/0125210 | A1 | * | 9/2002 | Rabarot et al. | ................. 216/26 |
| 2003/0232179 | A1 | * | 12/2003 | Steenblik et al. | ......... 428/195.1 |

FOREIGN PATENT DOCUMENTS

JP 2597037 1/1997

* cited by examiner

*Primary Examiner*—Allan Olsen
(74) *Attorney, Agent, or Firm*—McDermott Will & Emery LLP (57) ABSTRACT

In a method for forming a lens according to the present invention, a digging step of digging a depression includes a depositing substep of depositing a pattern film on a surface of a base film, the pattern film being made of a second material and in an inverted shape of the depression, a forming substep of forming an embedding film to flatten the surface of the pattern film, the embedding film being made of a third material and embedding therein the pattern film, and an etch-back substep of conducting etch-back on a surface of the embedding film toward the base film to dig the depression, and an etch rate of the second material is higher than an etch rate of the third material.

18 Claims, 10 Drawing Sheets

METHOD FOR FORMING ON-CHIP LENS INCLUDING PROCESS OF FORMING DEPRESSION BY USING ETCH-BACK METHOD, AND METHOD FOR MANUFACTURING SOLID-STATE IMAGING APPARATUS INCLUDING PROCESS OF FORMING IN-LAYER MICRO LENS USING THE METHOD FOR FORMING ON-CHIP LENS

BACKGROUND OF THE INVENTION (1) Field of the Invention

The present invention relates to a method for forming an on-chip lens and a method for manufacturing a solid-state imaging apparatus, and particularly to a technique for forming a depression by using an etch-back method.

(2) Description of the Related Art

Solid-state imaging apparatuses are widely used as image input apparatuses for a portable apparatus and a camera. Now, there is a demand for further miniaturizing the solid-state imaging apparatuses and increasing the number of the pixels thereof. Therefore, the solid-state imaging apparatuses have a structure that includes, in addition to the top lenses that have been conventionally provided, lenses (in-layer lens) nearer to the photoelectric converter unit (photodiode) than the top lenses are. In other words, for realizing a solid-state imaging apparatus having small pixels, it is necessary to form an on-chip lens including an in-layer lens in terms of the sensitivity and the smear characteristics.

Regarding the in-layer lens of a solid-state imaging apparatus, method for forming the in-layer lens is suggested by various documents (Japanese Laid-open Patent Application Publication No. 2002-246578, Japanese Laid-open Patent Application Publication No. H06-61487, Japanese Patent Publication No. 2597037, and Japanese Laid-open Patent Application Publication No. 2002-353428).

Figure 1A:
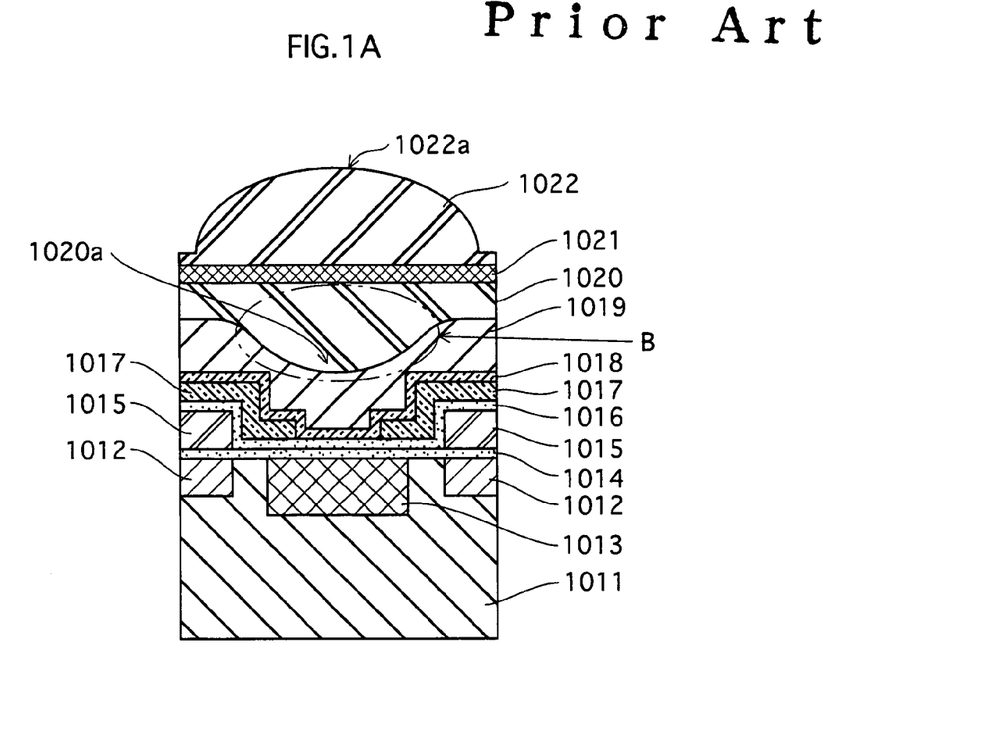
FIG. 1A is a sectional view schematically showing a structure of a solid-state imaging apparatus in which an in-layer lens 1020a is formed by a conventional heat-flow method.
Figure 1B:
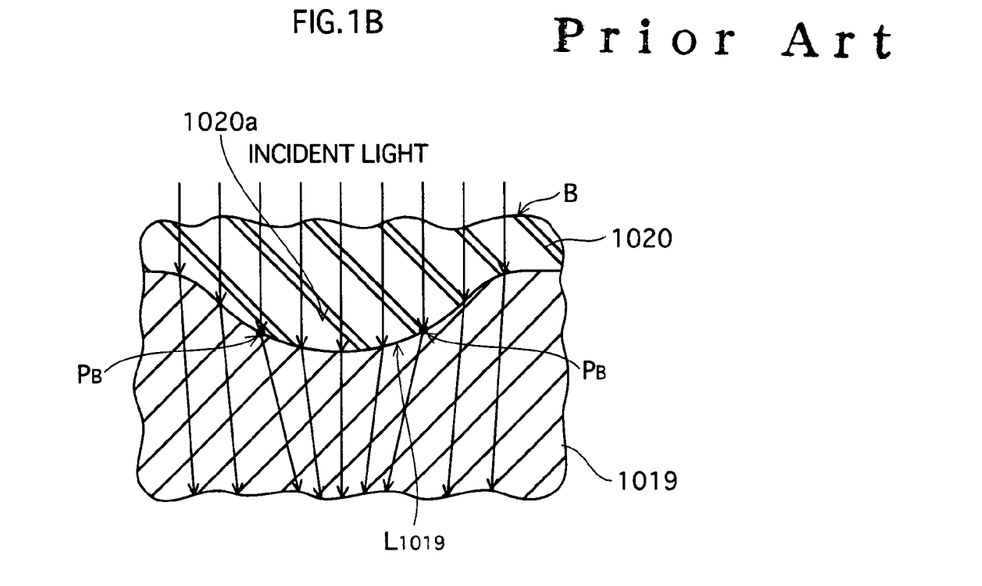

For example, the following describes a structure of a solid-state imaging apparatus in which the in-layer lenses are formed by the method suggested by Japanese Laid-open Patent Application Publication No. 2002-246578, with reference to FIG. 1A and FIG. 1B. Note that only the imaging area of the solid-state imaging apparatus is illustrated in FIG. 1A and FIG. 1B.

As FIG. 1A shows, the solid-state imaging apparatus has a gate insulation film 1014 formed on one of main surfaces of a semiconductor substrate 1011, and transfer electrodes 1015 are formed at intervals on the gate insulation film 1014. Over the transfer electrodes 1015, an interlayer insulation film 1016, a light shielding film and a passivation film 1018 are formed in this order. On the passivation film 1018, an in-layer lens first formation film 1019 and an in-layer lens second formation film 1020 are formed, and a color filter film 1021 and a top lens formation film 1022 are also formed. Moreover, in the area extending inwardly from the main surface of the semiconductor substrate 1011, a pair of charge transfer channel units 1012, and a photoelectric converter unit 1013 located therebetween are formed.

The top lens formation film 1022 is in a convex shape where a portion corresponding to the photoelectric converter unit 1013 is upheaved. This upheaved portion is a top lens 1022a, which is formed for each pixel. On the other hand, the in-layer lens first formation film 1019 is in a concave shape where a portion corresponding to the photoelectric converter unit 1013 is depressed. This depressed portion is embedded by the in-layer lens second formation film 1020, and this forms an in-layer lens 1020a.

In Japanese Laid-open Patent Application Publication No. 2002-246578, a film made of a BPSG (Boron Phosphorous Silicon Glass) is formed along the surface of the passivation film 1018. Such a BPSG film is processed by the heat-flow method. As a result, the in-layer lens first formation film 1019, in which the portion corresponding to the photoelectric converter unit 1013 is depressed, is formed. However, in the case of forming the in-layer lens by the heat-flow method, an inflection point $P_B$ is formed at the depression of a boundary $L_{1019}$ between the in-layer lens first formation film 1019 and the in-layer lens second formation film 1020, as FIG. 1B shows. Therefore, if the technique disclosed by Japanese Laid-open Patent Application Publication No. 2002-246578 is applied, only an in-layer having a small effective diameter can be formed. This should be improved, from the viewpoint of improving the light concentration efficiency.

Japanese Patent Publication No. 2597037 suggests a technique to form a mask having a fine opening at a portion corresponding to the photoelectric converter unit, and form a depression having a sector-shaped cross section through the opening, by using the isotropic etching to form the lens.

DISCLOSURE OF THE INVENTION

Problems to be Solved by the Invention

However, with conventional techniques including the four Patent Documents above (Japanese Laid-open Patent Application Publication No. 2002-246578, Japanese Laid-open Patent Application Publication No. H06-61487, Japanese Patent Publication No. 2597037, and Japanese Laid-open Patent Application Publication No. 2002-353428), it is difficult to form a lens that realizes high light concentration efficiency and high design flexibility. In other words, if the technique disclosed by Japanese Laid-open Patent Application Publication No. 2002-246578 is applied, only an in-layer having a short effective diameter can be formed due to the inflection point. Also, if the techniques disclosed by the Japanese Patent Publication No. 2597037 and so on are applied, it is difficult to form a lens with high accuracy in size. Actually, if the technique disclosed by the Japanese Patent Publication No. 2597037 is applied for forming a lens, it is difficult to form a semispherical lens, because the isotropic etching is used. With this technique, only a lens having an irregular shape (e.g. a bathtub shape) can be formed.

If the in-layer lens shown in FIG. 1A is inverted to form a lens in the same direction as the top lens 1022a, the difficulty can be diminished. However, if such a structure is applied, the length between the photoelectric converter unit and the center of the in-layer lens becomes long, and this lowers the light concentration efficiency relating to oblique incident light.

SUMMARY OF THE INVENTION

The present invention is made to solve the above-described problems. The object of the present invention is to provide a method for forming an on-chip lens that has a large effective diameter and can realize high light concentration efficiency even as to oblique incident light, and to provide a method for manufacturing a solid-state imaging apparatus including the method for forming the on-chip lens.

The above object is fulfilled by a method for forming an on-chip lens, comprising:

(1) a depositing step of depositing a base film on a surface of a substrate, the base film being translucent and made of a first material; and (2) a digging step of digging a depression in a portion of the base film.

In the method according to the present invention, the digging step includes (2-1) a depositing substep of depositing a pattern film on a surface of the base film, the pattern film being made of a second material and in an inverted shape of the depression, (2-2) a forming substep of forming an embedding film to flatten the surface of the pattern film, the embedding film being made of a third material and embedding therein the pattern film, and (2-3) an etch-back substep of conducting etch-back on a surface of the embedding film toward the base film to dig the depression.

Also, an etch rate of the second material is higher than an etch rate of the third material.

Also, a method for manufacturing a solid-state imaging apparatus according to the present invention uses the above-described method for forming the on-chip lens, to form the in-layer lens.

With the above-described method for forming the on-chip lens according to the present invention and the above-described method for manufacturing the solid state imaging apparatus according to the present invention, the pattern film in an inverted shape of the depression is formed using the second material whose etch rate is higher than the etch rate of the third material constituting the embedding film, and the etch-back is conducted on the embedding film toward the base film. Accordingly, with the above-described method for forming the on-chip lens according to the present invention and the above-described method for manufacturing the solid state imaging apparatus according to the present invention, it is possible to change the start timing of the etch-back conducted on the base film, using the difference between the etch rates of the second material and the third material. As a result, it is possible to form the depression, which is the main constituent of the lens, as designed. As described above, the formation method according to the present invention can form a depression that is in the shape similar to the shape of the pattern film, by differing the etch rate of the pattern film made of the second material and the material of the embedding film embedding therein the pattern film. This is for the following reason:

With the above-described method for forming the on-chip lens according to the present invention and the above-described method for manufacturing the solid state imaging apparatus according to the present invention, the etch rate of the second material is higher than the etch rate of the third material. Therefore, when the etching is conducted on the surface of the flattened embedding film and the etching reaches the pattern film, the etching speed for the pattern film differs from the etching speed for the embedding film in accordance with the etching rate ratio. In other words, the start timing of the etching on the base film becomes earlier as the thickness of the embedding film increases, and the start timing of the etching on the base film becomes later as the thickness of the pattern film increases and the thickness of the embedding film decreases. The difference of the etching speeds of the pattern film and the embedding film causes the difference of the start timing of the etching on the base film. As a result, a depression having a shape similar to the shape of the pattern film can be formed.

In this way, with the method for forming the on-chip lens according to the present invention and the method for manufacturing the solid state imaging apparatus according to the present invention, it is possible to precisely control the shape of the depression by controlling the shape of the pattern film formed as a projection on the base film. Here, note that the formation of the projecting pattern film is much easier than the formation of the depression.

Also, with the method for forming the on-chip lens according to the present invention and the method for manufacturing the solid state imaging apparatus according to the present invention, the heat-flow method is not used for forming the depression unlike the technique suggested in Japanese Laid-open Patent Application Publication No. 2002-246578. Therefore, it is possible to prevent that an inflection point is formed at a boundary of the depression. This is an advantage for forming the in-layer lens having a large effective diameter. Also, with the method for forming the on-chip lens according to the present invention and the method for manufacturing the solid state imaging apparatus according to the present invention, it is possible to form a lens so as to be a projection that projects toward the substrate. Therefore, it is possible to achieve high light concentration efficiency as to oblique incident light as well.

Accordingly, the method for forming the on-chip lens and the method for manufacturing the solid-state imaging apparatus according to the present invention, it is possible to form an on-chip lens that achieves a large effective diameter, and high light concentration efficiency as to oblique incident light, without difficulties.

The following are modifications of the method for forming the on-chip lens and the method for manufacturing the solid-state imaging apparatus according to the present invention.

In the method for forming the on-chip lens and the method for manufacturing the solid-state imaging apparatus according to the present invention, an etch rate ratio of the second material to the third material may be from 1.5 to 2.5 inclusive.

In the method for forming the on-chip lens and the method for manufacturing the solid-state imaging apparatus according to the present invention, an etch rate ratio of the third material to the first material may be from 0.5 to 1.5 inclusive.

In the method for forming the on-chip lens and the method for manufacturing the solid-state imaging apparatus according to the present invention, an etch rate ratio of the second material to the first material may be from 1.5 to 2.5 inclusive.

In the forming substep of forming the pattern film, a photosensitive resin may be used as the second material, a film made of the photosensitive resin may be formed on the base film, a mask having a prescribed opening may be formed on the film made of the photosensitive resin, and the film made of the photosensitive resin may be exposed and developed from above the mask to form the pattern film.

In the depositing substep of depositing the pattern film, a photosensitive resin may be used as the second material, a pattern preparation film may be formed on the base film, the pattern preparation film having been subjected to patterning by a lithography method, and the pattern preparation film may be flowed by applying a heat not lower than 150° C. to form the pattern film.

In the forming substep of forming the embedding film, a viscous fluid material with hardenability may be used as the third material, and the viscous fluid material may be applied on the pattern film formed on the base film to form the embedding film.

In the forming substep of forming the embedding film, a resin may be used as the viscous fluid material.

In the depositing substep of depositing the pattern film and the forming substep of forming the embedding film, a synthetic resin may be used as the second material and the third material, and a double bond density of the second material may be higher than a double bond density of the third material.

In the depositing substep of depositing the pattern film, silicon nitride or silicon nitroxide may be used as the second material, and in the forming substep of forming the embedding film, the etch-back may be conducted by dry etching using a gas including fluorine.

The method for forming the on-chip lens and the method for manufacturing the solid-state imaging apparatus according to the present invention may further comprise a filling step of filling a forth material in the depression formed in the digging step of digging the depression, the fourth material being translucent and having a refractive index different from a refractive index of the first material.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 1B is a sectional view schematically showing optical characteristics of the in-layer lens 1020a;

FIG. 2A, FIG. 2B and FIG. 2C show manufacturing processes for a solid-state imaging apparatus 1 according to an embodiment of the present invention, wherein

FIG. 3A, FIG. 3B and FIG. 3C show manufacturing processes for the solid-state imaging apparatus 1 according to the embodiment of the present invention, wherein

FIG. 4A and FIG. 4B show manufacturing processes for the solid-state imaging apparatus 1 according to the embodiment of the present invention, wherein

FIG. 5A and FIG. 5B show, among manufacturing processes for the solid-state imaging apparatus 1 according to the embodiment of the present invention, manufacturing processes for forming a depression for the in-layer lens 20a, wherein

FIG. 8B is a sectional view schematically showing optical characteristics of the in-layer lens 20a;

DESCRIPTION OF THE PREFERRED EMBODIMENT

The following describes an embodiment of the present invention, with reference to drawings. Note that the embodiment below is an example for clearly describing the structure and the actions and the advantages of the present invention, and it does not limit the present invention except for the essential part for achieving the advantages.

1. Manufacturing Method for Solid-State Imaging Apparatus 1

The following describes a manufacturing method for a solid-state imaging apparatus 1 according to an embodiment of the present invention, with reference to FIG. 2A to FIG. 4C. Note that regarding the manufacturing method for the solid-state imaging apparatus 1 according to the present embodiment, only a characteristic portion, which is a portion of imaging area that corresponds to a single pixel, is explained. A vertical transfer unit, a horizontal transfer unit, an amplifier unit and so on of the solid-state imaging apparatus 1 have the same structures as those of the conventional art, and they are manufactured in the same manner as the conventional arts. Therefore, illustrations and explanations thereof are omitted here.

Figure 2A:
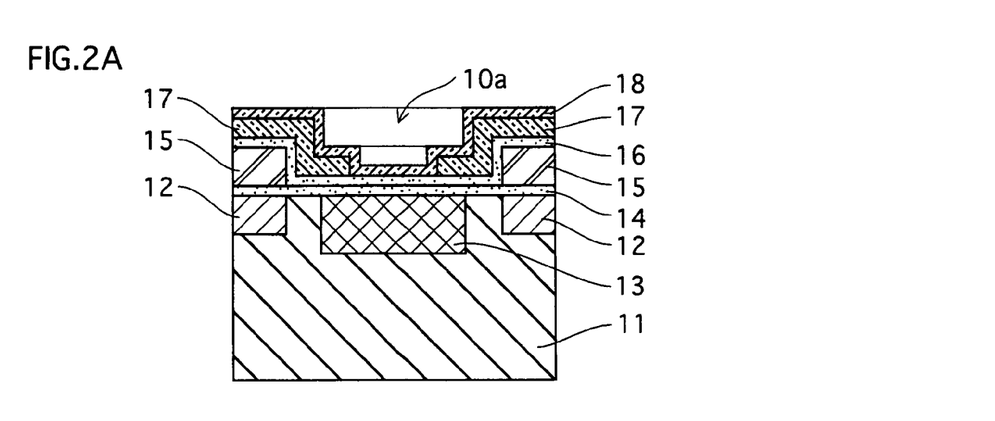
FIG. 2A is a sectional view schematically showing that a depression 10a is formed above a photoelectric converter unit 13.

As FIG. 2A shows, n-type impurities are inwardly dispersed from a surface of a p-type semiconductor substrate 11, and a pair of charge transfer channel units 12 are formed with a gap therebetween. Then, the main surface of the semiconductor substrate is coated with a gate insulation film 14 as an oxide film. Next, on the surface of the gate insulation film 14, a polycrystalline silicon film is formed. After that, the reactive ion etching and the wet etching are conducted to leave only portions of the polycrystalline silicon film that correspond to the charge transfer channel units 12. These remaining portions of the polycrystalline silicon film at the locations corresponding to the charge transfer channel units 12 serve as transfer electrodes 15.

An interlayer insulation film 16 is formed so as to cover the transfer electrodes 15 and the gate insulation film 14. Then, a photoelectric converter unit 13 is formed by implanting n-type impurity ions (e.g. phosphorous ion: $P^+$) and p-type impurity ions (e.g. boron ion: $B^+$) in this order, with using the transfer electrodes 15 as a mask for the ion implantation and the gate insulation film 14 and the interlayer insulation film 16 as buffer films. Note that although the photoelectric converter unit 13 is illustrated as a single area in FIG. 2A to FIG. 4A and so on, it is actually structured with an n-type area and a p-type area.

Also, a light shielding film 17 having an opening at a location corresponding to the photoelectric converter unit 13 is formed on the interlayer insulation film 16, and a passivation film 18 is formed on the light shielding film 17.

Figure 2B:
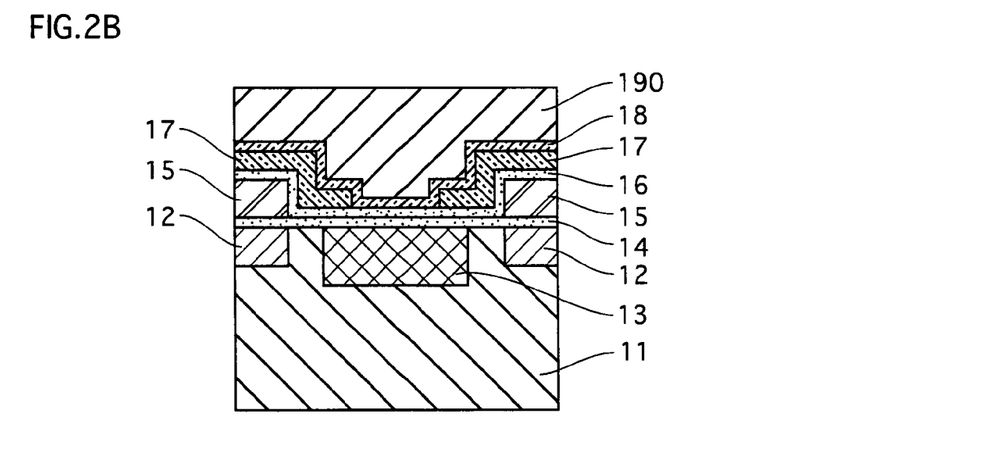
FIG. 2B is a sectional view schematically showing that an in-layer film first preparation film 190 is formed so as to embed therein the depression 10a, and FIG. 2C is a sectional view schematically showing that a pattern resist preparation film 500 is deposited on a surface of the in-layer lens first preparation film 190.

Next, as FIG. 2B shows, in-layer lens first preparation film 190 is formed such that a depression 10a located above the photoelectric converter unit 13 is filled. The in-layer lens first preparation film 190 is an oxide film, and formed by the CVD (Chemical Vapor Deposition) method with use of BPSG (Boron Phosphorous Silicon Glass), NSG (Non-doped Silicate Glass), Sin and SiON, for example. Here, the in-layer lens first preparation film 190 is formed such that the surface thereof is flattened.

Figure 2C:
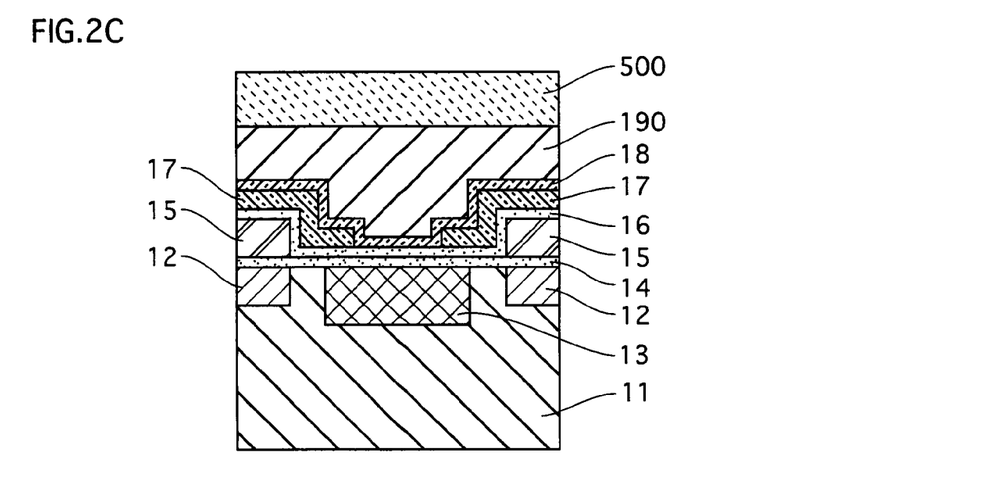
Figure 3A:
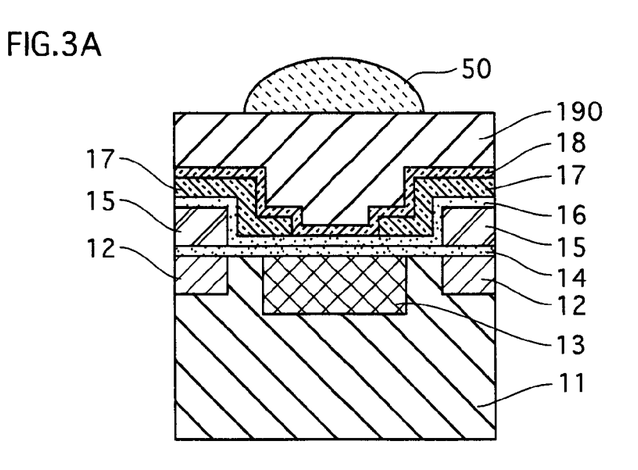
FIG. 3A is a sectional view schematically showing that a pattern resist film 50 is formed on the in-layer lens first preparation film 190.

As FIG. 2C shows, a pattern resist preparation film 500 is deposited on the surface of the in-layer lens first preparation film 190 that has been flattened. For flattening the surface, the heat-flow method is conducted at 150° C. The pattern resist preparation film 500 is formed by the CVD method or the like, using SiN, for example. A pattern resist film 50 having a shape shown in FIG. 3A is obtained by conducting photoresisting, lithography, resist baking and etching on the pattern resist preparation film 500 formed by the deposition. Here, the pattern resist film 50 is in the inverted shape of the depression 19a to be used for forming the in-layer lens.

Figure 3B:
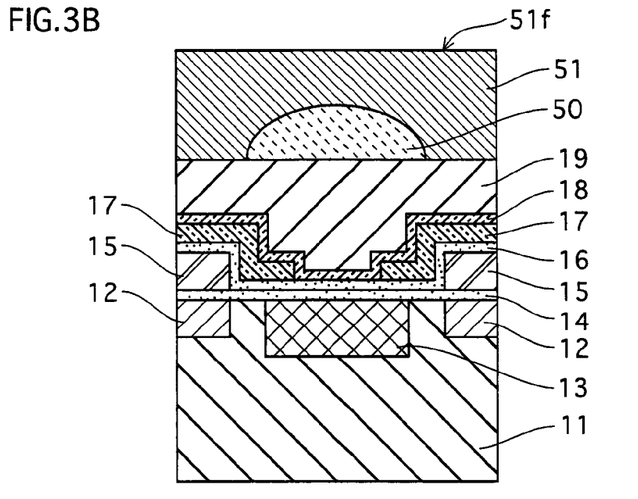
FIG. 3B is a sectional view schematically showing that an embedding resist film 51 is formed so as to embed therein the pattern resist film 50.

As FIG. 3B shows, an embedding resist film 51 is formed such that the pattern resist film 50 formed in the above-described manner is embedded. The embedding resist film 51 is an oxide film, and a surface 51f thereof is flattened by the flow method and the CMP method, using BPSG, NSG and SOG (Spin On Glass, for example.

Or instead, if the pattern resist preparation film 500 is formed by photoresisting, the pattern resist film 50 having a shape shown in FIG. 3A can be formed by conducting lithography, resist baking and etching on the pattern resist preparation film 500. If this is the case, a material having a molecular structure different from that of the photoresist, such as SOG (Spin On Glass) as an oxide film and a acrylic resin, are used for the embedding resist film 51. If the surface 51f is not flattened enough by applying the dissolved resin, the etch-back method or the like is to be conducted.

Figure 3C:
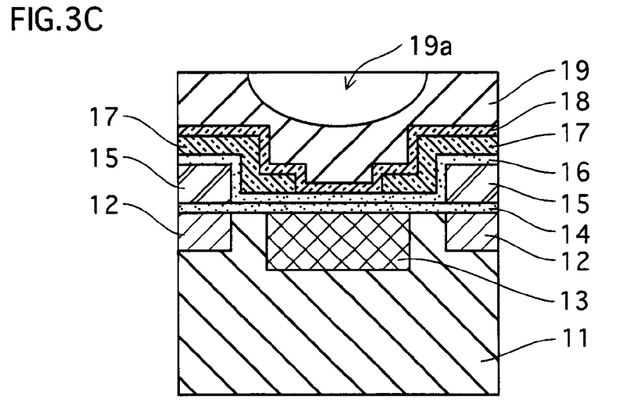
FIG. 3C is a sectional view schematically showing that a depression 19a is formed by conducting etch-back.

Next, by conducting the etch-back on the surface 51f shown in FIG. 3B, an in-layer lens first formation film 19 having the depression 19a is completed as FIG. 3C shows. Note that the processes from FIG. 3A to FIG. 3C are the most characteristic part of the manufacturing method according to the embodiment of the present invention. Therefore, the process for forming the depression 19a is described later in detail.

Figure 4A:
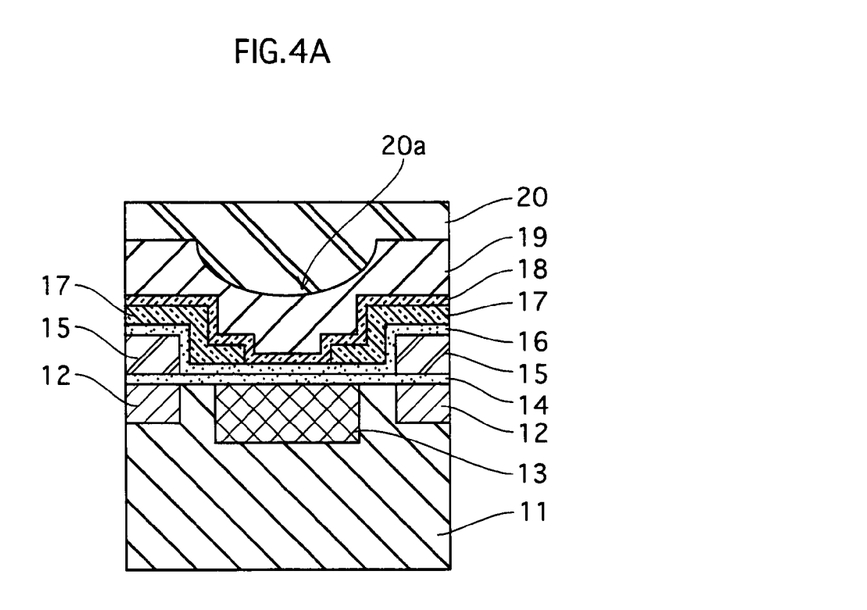
FIG. 4A shows that an in-layer lens 20a has been formed.

As FIG. 4A shows, an in-layer lens second formation film 20 is formed to fill the depression part 19a formed in the above-described process. The in-layer lens second formation film 20 is formed by the CVD method or the like, using SiN or SiON, for example. Here, a refractive index of a material used for forming the in-layer lens second formation film 20 is different from that of a material used for the in-layer lens first formation film 19. The portion of the in-layer lens second formation film 20 filled in the depression 19a of the in-layer lens first formation film 19 serves as an in-layer lens 20a.

Figure 4B:
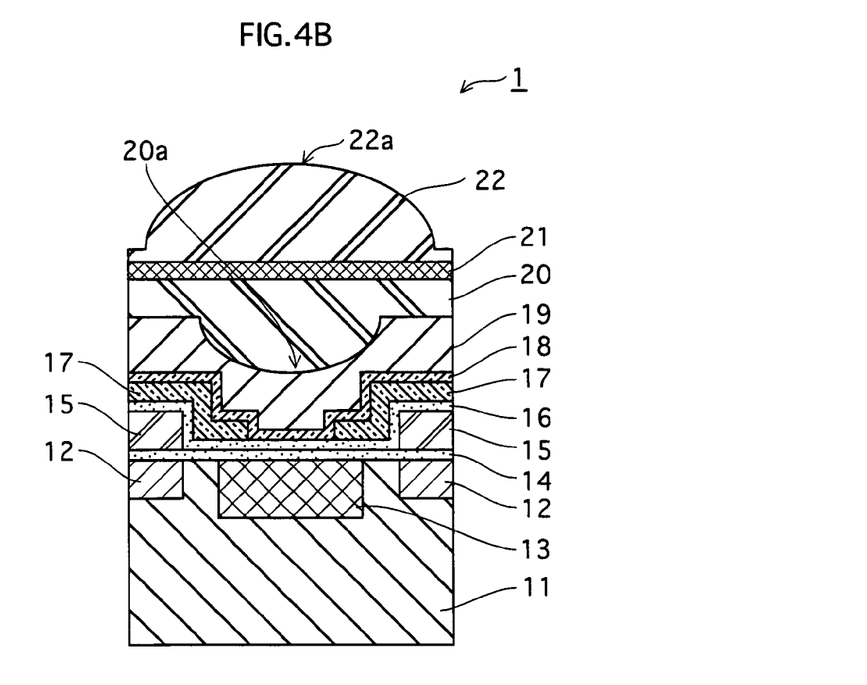
FIG. 4B is a sectional view schematically showing that a top lens 22a has been formed.

Finally, as FIG. 4B shows, a color filter film 21 and a top lens formation film 22 are deposited on the surface of the in-layer second formation film 20 in this order to form a top lens 22a such that a portion of the top lens formation film 22 corresponding to the photoelectric converter unit 13 has a shape of a projection that projects outwardly.

2. Method for Forming Depression 19a of In-Layer Lens First Formation Film 19

Figure 5A:
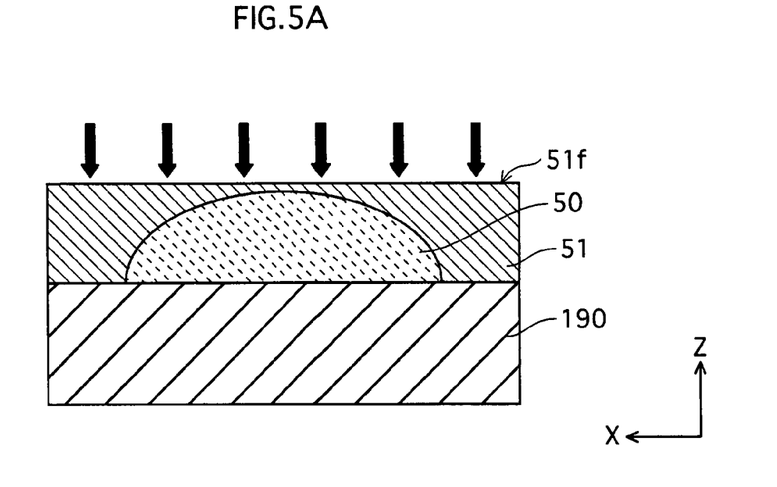
FIG. 5A is a sectional view schematically showing that etch-back has not been conducted.
Figure 5B:
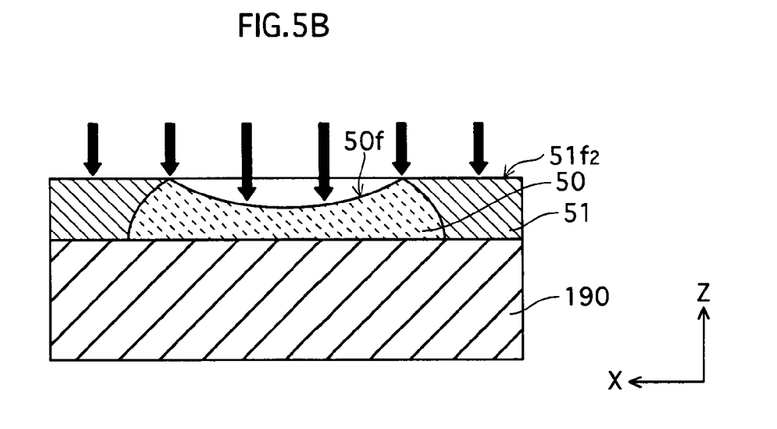
FIG. 5B is a sectional view schematically showing that etch-back is being conducted.
Figure 5C:
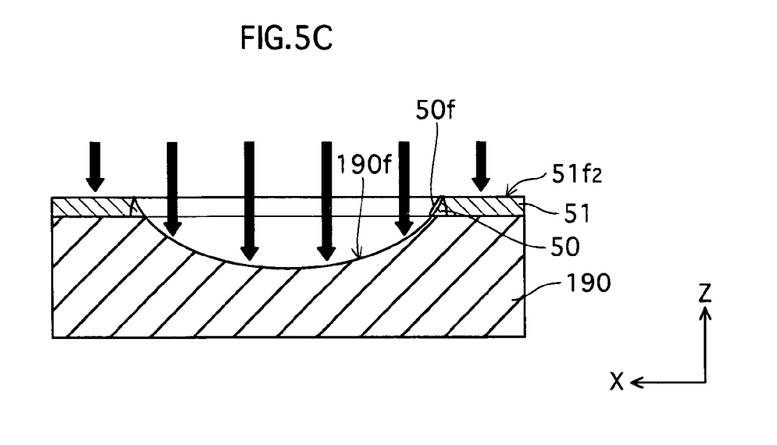
FIG. 5C is a sectional view schematically showing that etch back has been conducted.

Among processes for manufacturing the solid-state imaging apparatus 1 according to the embodiment above, the following describes in detail a method for forming the depression 19a of the in-layer lens first formation film 10, with reference to FIG. 5A, FIG. 5B and FIG. 5C.

As described above, the etch-back is conducted after the pattern resist film 50, which is in the inverted shape of the depression 19a to be obtained, and the embedding resist film 51 for embedding therein the pattern resist film 50 are deposited on the surface of the in-layer lens first preparation film 190 (the state illustrated in FIG. 5A). In this embodiment, the etch rate for the pattern resist film 50 is set to be different from the etch rate for the embedding resist film 51. Specifically, in the manufacturing method according to this embodiment, a material having a higher etch rate than the etch rate of a material used for forming the embedding resist film 51 is selectively used for forming the pattern resist film 50. Moreover, the etch rate of the material for forming the pattern resist film 50 is substantially equal to the etch rate of the material for forming the in-layer lens first formation film 19.

As FIG. 5B shows, in the conduct of the etch-back (anisotropic etching), after the surface of the pattern resist film 50 is exposed, the etching on the pattern resist film 50 progresses faster than on the surface 51f₂ of the embedding resist film 51, in accordance with the ratio between the etching rates. Also, the way of the progression of the etching on the pattern resist film 50 depends on the timing of the exposure of portions of the pattern resist film 50. As FIG. 5 B shows, if the pattern resist film 50 having a cross section in a semi-elliptical shape is used, the etching progresses such that the shape of the surface 50f becomes an inverse of the shape of the pattern resist film 50.

As FIG. 5C shows, in the manufacturing method according to this embodiment, the etch rate for the pattern resist film 50 and the etch rate for the in-layer lens first preparation film 190 are substantially the same. Therefore, the difference between the etching progression speeds for the pattern resist film 50 and the embedding resist film 51 is maintained while the in-layer lens first preparation film 190 is inwardly etched. The etch-back progresses such that the surface is to be in the shape 190f that is an inverted shape of the pattern resist film 50.

Finally, the etch-back completes when the pattern resist film 50 and the embedding resist film 51 run out, and the formation of the in-layer first formation film 19 having the depression 19a shown in FIG. 3C completes.

3. Etch Rate Ratio Among Materials

In the manufacturing method for the solid-state imaging apparatus according to this embodiment having the characteristics described above, the following etch rate ratios are preferable.

(1) Patten Resist Film 50 and Embedding Resist Film 51

In this embodiment, from the view point of the formation of the in-layer lens 20a of the solid-state imaging apparatus 1, it is preferable that the etch rate ratio of the material of the embedding resist film 51 to the material of the pattern resist film 50 is from 1.5 to 2.5 inclusive.

(2) Embedding Resist Film 51 and In-layer Lens First Formation Film 19

In this embodiment, from the same view point as described above, it is preferable that the etch rate ratio is from 0.5 to 1.5 inclusive.

(3) In-layer Lens First Formation Film 19 and Pattern Resist Film 50

In this embodiment, it is preferable that the etch rate ratio of the material for the pattern resist film 50 to the material for the in-layer lens first formation film 19 is from 1.5 to 2.5 inclusive.

Specifically, combinations shown in a table below can be applied.

TABLE 1

| MATERIAL 1 | MATERIAL 2 | ETCHING GAS | ETCH RATE RATIO |
|---|---|---|---|
| NOVOLAC | ACRYL | $CF_4 + O_2$ | 2:1 |
| NOVOLAC | SOG | $CF_4 + O_2$ | 2.5:1 |
| SiN | SOG | $CF_4 + O_2$ | 1.5:1 |
| SiN | NSG | $CF_4 + O_2$ | 2:1 |
| SiON | NSG | $CF_4 + O_2$ | 1.5:1 |
| NOVOLAC | SiN | $CF_4 + O_2$ | 1:1 |

In Table 1, novolac is the main constituent of the photoresist.

In the Table 1, examples of the etch rate ratio are shown. However, they may be modified by changing conditions such as the types of the etching gases and the mixing ratio thereof, and the pressure.

4. Progress of Etch-Back

Figure 6:
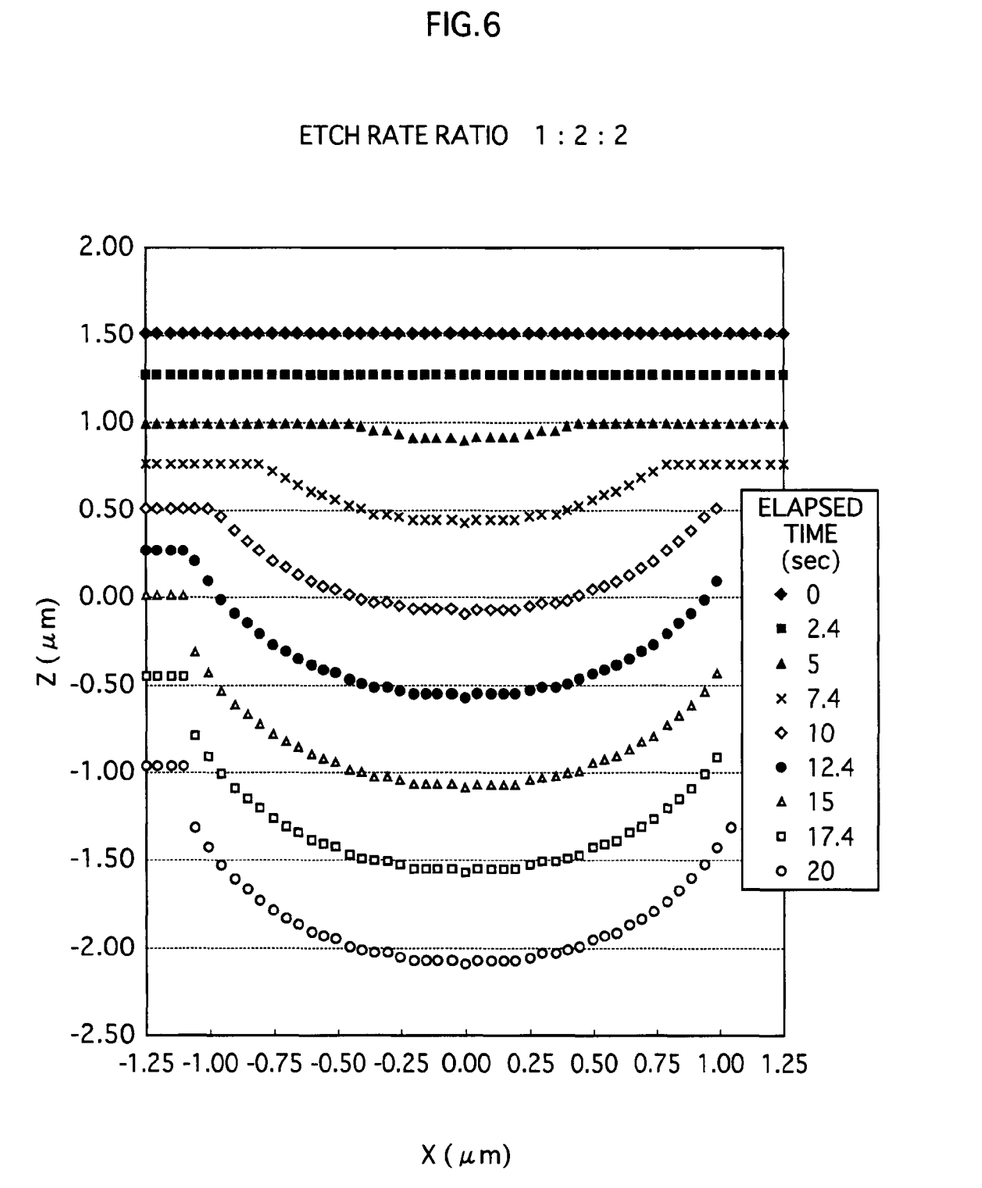
FIG. 6 is a characteristics diagram showing transition of a shape of a surface of the depression during formation of the depression by the etch-back.
Figure 7:
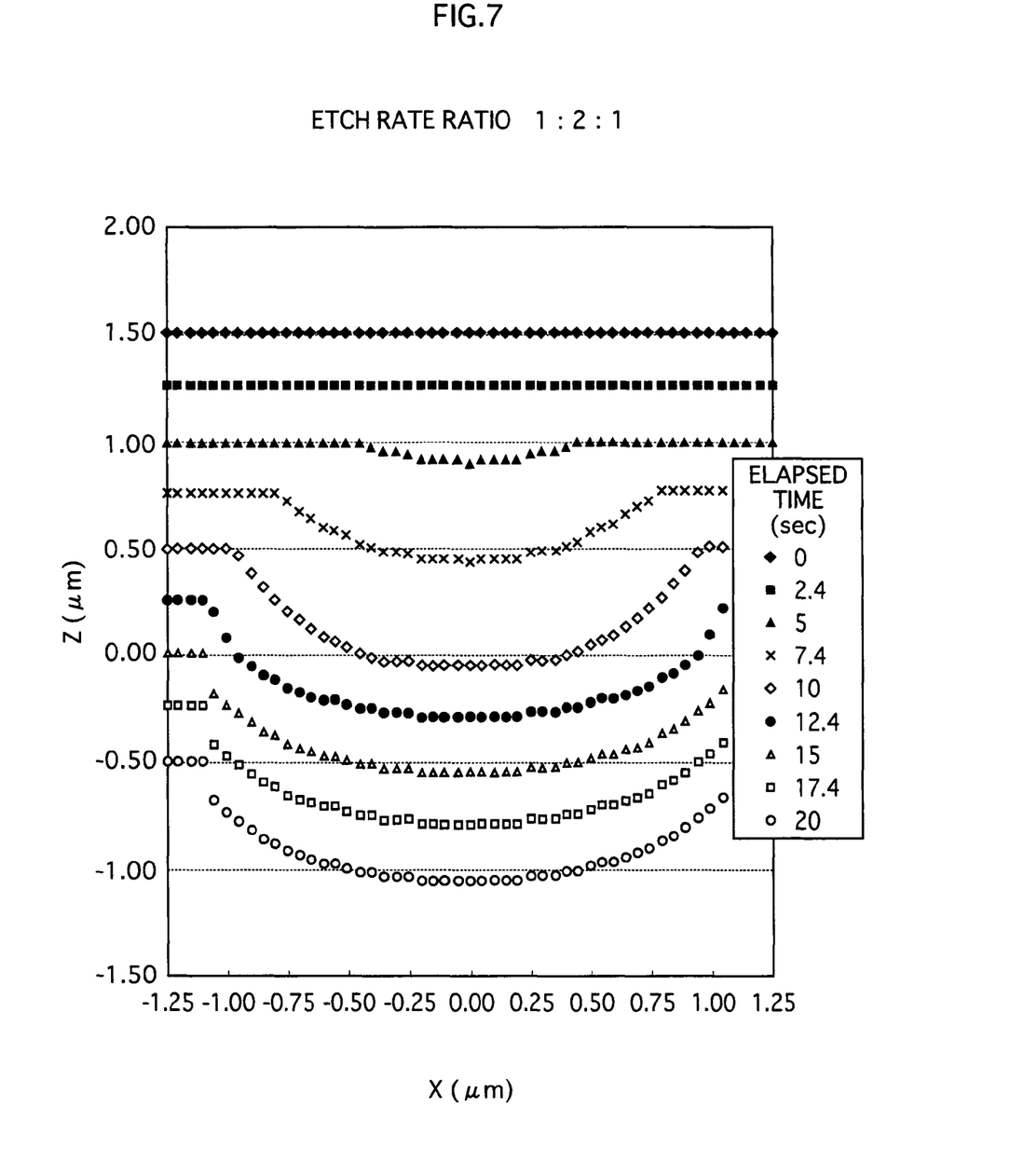
FIG. 7 shows a relation between a etch rate ratio and progression of the formation of the depression by the etch-back.

The following describes the relation between the above-described etch rate ratio and the progress of the etch-back with reference to FIG. 6 and FIG. 7. FIG. 6 shows the progress of the etch-back in the case where $\alpha$, $\beta$ and $\gamma$ satisfy the following relation, where the etch rates of the embedding resist film 51, the pattern resist film 50 and the in-layer lens first formation film 19 are $\alpha$, $\beta$ and $\gamma$ respectively.

$\alpha:\beta:\gamma=1:2:2$ [Ratio 1]

FIG. 7 shows the progress of the etch-back in the case where $\alpha$, $\beta$ and $\gamma$ satisfy the following relation.

$\alpha:\beta:\gamma=1:2:1$ [Ratio 2]

Between FIG. 6 and FIG. 7, the ratio of $\gamma$ to $\alpha$ and $\beta$ is different. In other words, in the case of FIG. 7 where the etch rate of the in-layer lens first formation film 19 (in-layer lens first preparation film 190) is set to be ½, the etching amount at a time when the same period has elapsed is ½ of the case of FIG. 6. However, since the etching is the anisotropic etching, the etching amount in the width direction is constant, and the depth of the depression becomes shallow.

As described above, with this embodiment, it is possible to form the depression 19a with a precisely defined shape by setting and controlling the etch rate ratio of the embedding resist film 51, the pattern resist film 50 and the in-layer lens first formation film 19 and the pattern shape of the pattern resist film 50. Therefore, it is possible to realize the in-layer lens 20a with high light concentration efficiency in the case of forming fine imaging pixels.

Note that in FIG. 6 and FIG. 7, [Ratio 1] and [Ratio 2] above are taken as examples of the relation among $\alpha$, $\beta$ and $\gamma$. However, the present invention is not limited to this.

Also, although this embodiment is explained based on the premise that the anisotropic is used, the isotropic etching may be used to realize the effect of the present invention, that is, the formation of the pattern film having the inverted shape. However, if the isotropic etching is used, there is a harmful effect that the size might be reduced. Therefore, it is preferable that the isotropic etching or a highly-isotropic etching method is used.

5. Formation of Pattern Resist Film 50

To form the pattern resist film 50 shown in FIG. 3A, various methods may be used depending on the material to be used. The following are example methods.

To form the pattern resist film 50, a method in which the heat-flow method is conducted after forming a photoresist may be used. Also, a method of previously forming a removable film with flowability, etching the film with the photoresist mask to form an isolated pattern, and conducting the heat-flow method on the pattern may be used.

Also, a pattern resist film having a trapezoidal shape can be realized by adjusting the exposure condition of the photoresist, though this is an extreme case.

6. Advantages

For the etch-back of the manufacturing method according to this embodiment, the etch rate of the material for the pattern resist film 50 is set to be higher than the etch rate of the material for the embedding resist film 51, and the shape of the pattern resist film 50 is set to be the inverse of the shape of the depression 19a to be formed. Therefore, when the etching started from the surface 51f of the flattened embedding resist film 51 reaches the pattern resist film 50, the etching speed of the pattern resist film 50 differs from the etching speed of the embedding resist film 51 according to the etch rate ratio. Then, due to this difference of the etching speed, the start timing of the etching on the in-layer lens first preparation film 190 as a base film differs, and the depression 19a in the shape similar to the shape of the pattern resist film 50 is formed.

In this way, with the manufacturing method for the solid-state imaging apparatus 1 according to this embodiment, for forming the in-layer lens 20a, it is possible to precisely control the shape of the depression 19a by controlling the shape of the pattern resist film 50 on the in-layer lens first preparation film 190 and the etch rate ratio. Note, as described above, that the formation of the projecting pattern film is much easier than the formation of the depression.

Figure 8A:
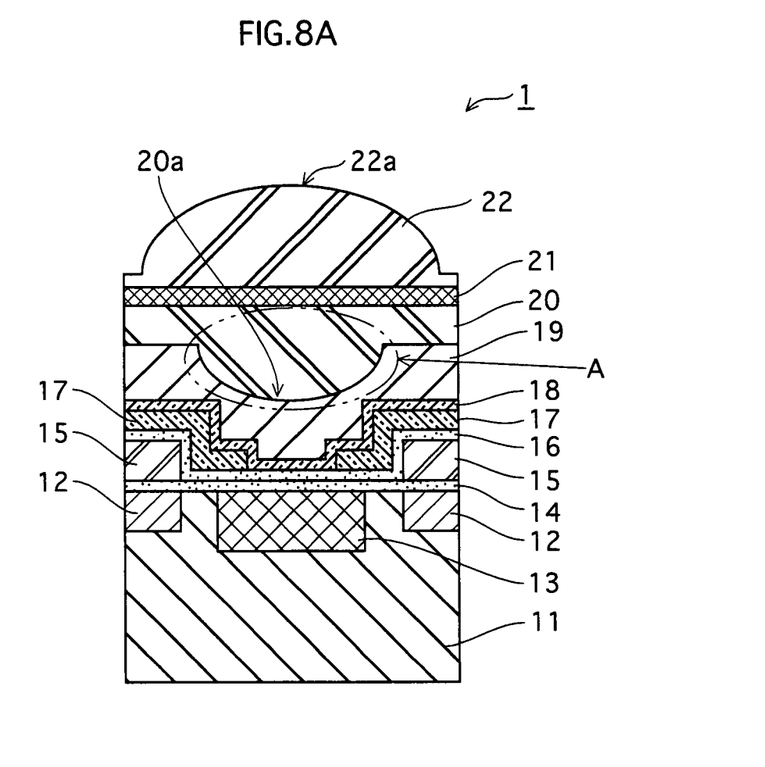
FIG. 8A is a sectional view schematically showing a structure of the in-layer lens 20a of the solid-state imaging apparatus according to the embodiment of the present invention.
Figure 8B:
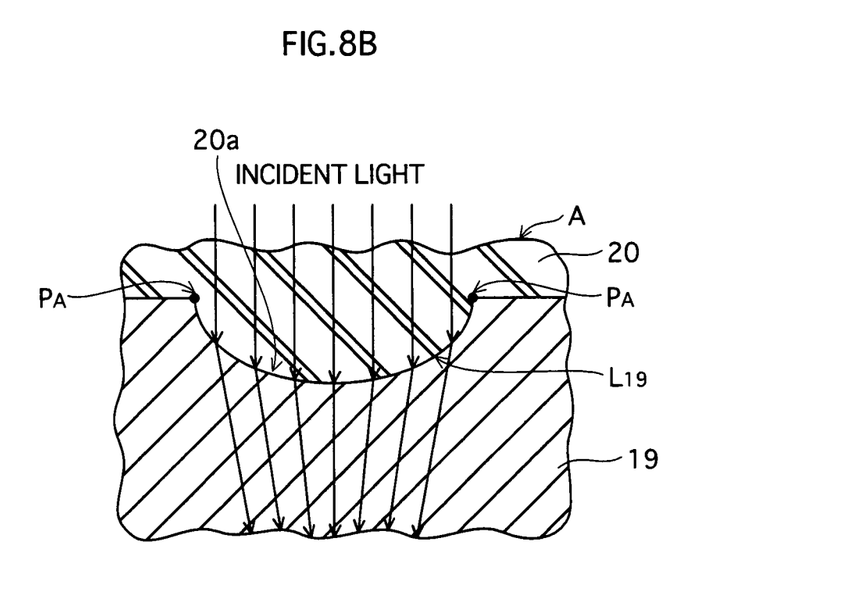

Also, as FIG. 8A and FIG. 8B show, with the manufacturing method for the solid-state imaging apparatus 1 according to this embodiment, the heat-flow method is not used for forming the depression unlike the technique suggested by Japanese Laid-open Patent Application Publication No. 2002-246578 described above. Therefore, it is possible to prevent that an inflection point is formed at a boundary $L_{19}$ of the depression 19a. This is an advantage for forming the in-layer lens 20a having a large effective diameter. In other words, the length between a point $P_A$ and a point $P_B$ is shown in FIG. 8B is the effective diameter of the in-layer lens 20a, and this is larger than the effective diameter of the conventional example shown in FIG. 1B.

Also, with the manufacturing method for the solid-state imaging apparatus 1 according to this embodiment, it is possible to form the in-layer lens 20a so as to be a projection that projects toward the semiconductor substrate 11. Therefore, it is possible to achieve high light concentration efficiency as to oblique incident light as well.

Accordingly, the method for forming the on-chip lens and the method for manufacturing the solid-state imaging apparatus according to the present invention, it is possible to form an on-chip lens that achieves a large effective diameter, and high light concentration efficiency even as to oblique incident light.

7. Flatness of Surface 51f of Embedding Resist Film 51

Figure 9:
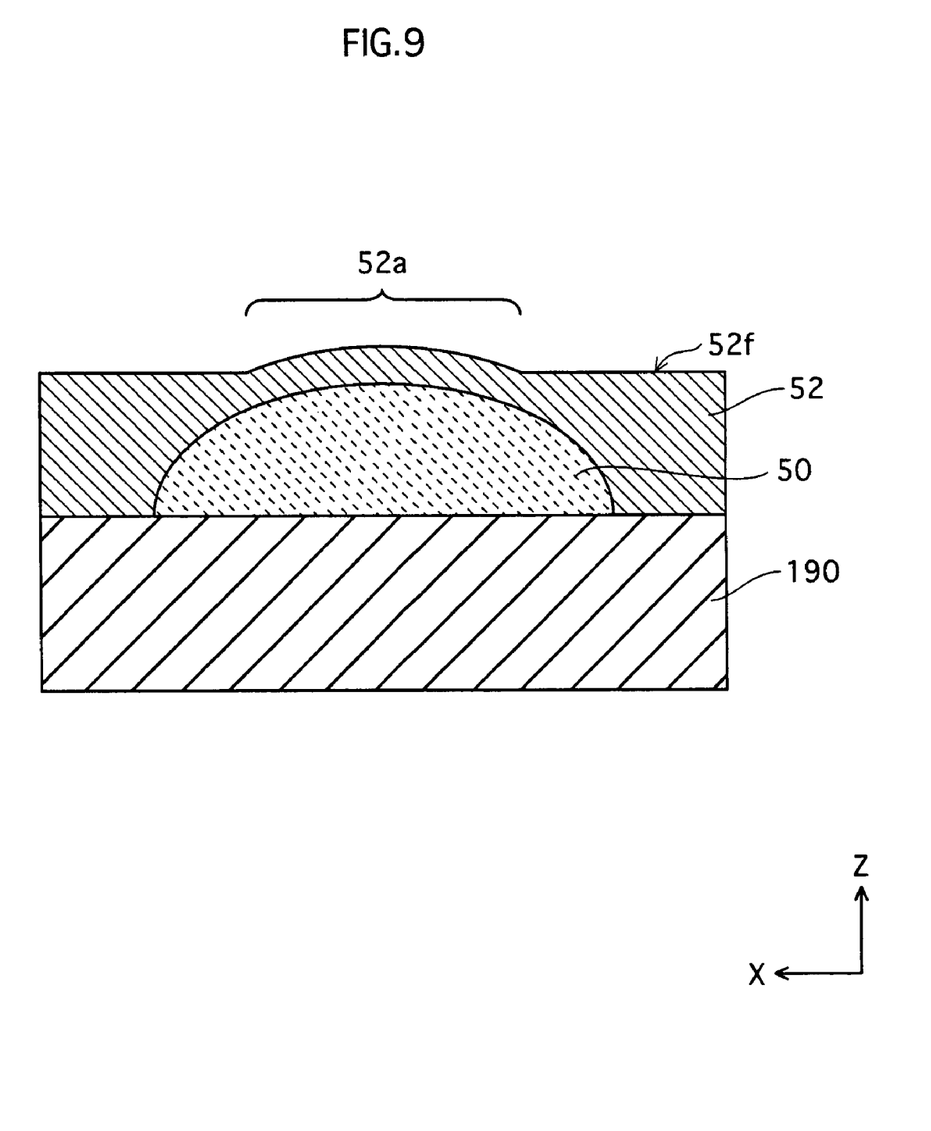
FIG. 9 is a sectional view schematically showing a case where a surface 52a of an embedding resist film 52 is not completely flattened and the etch-back has not been conducted.
Figure 10:
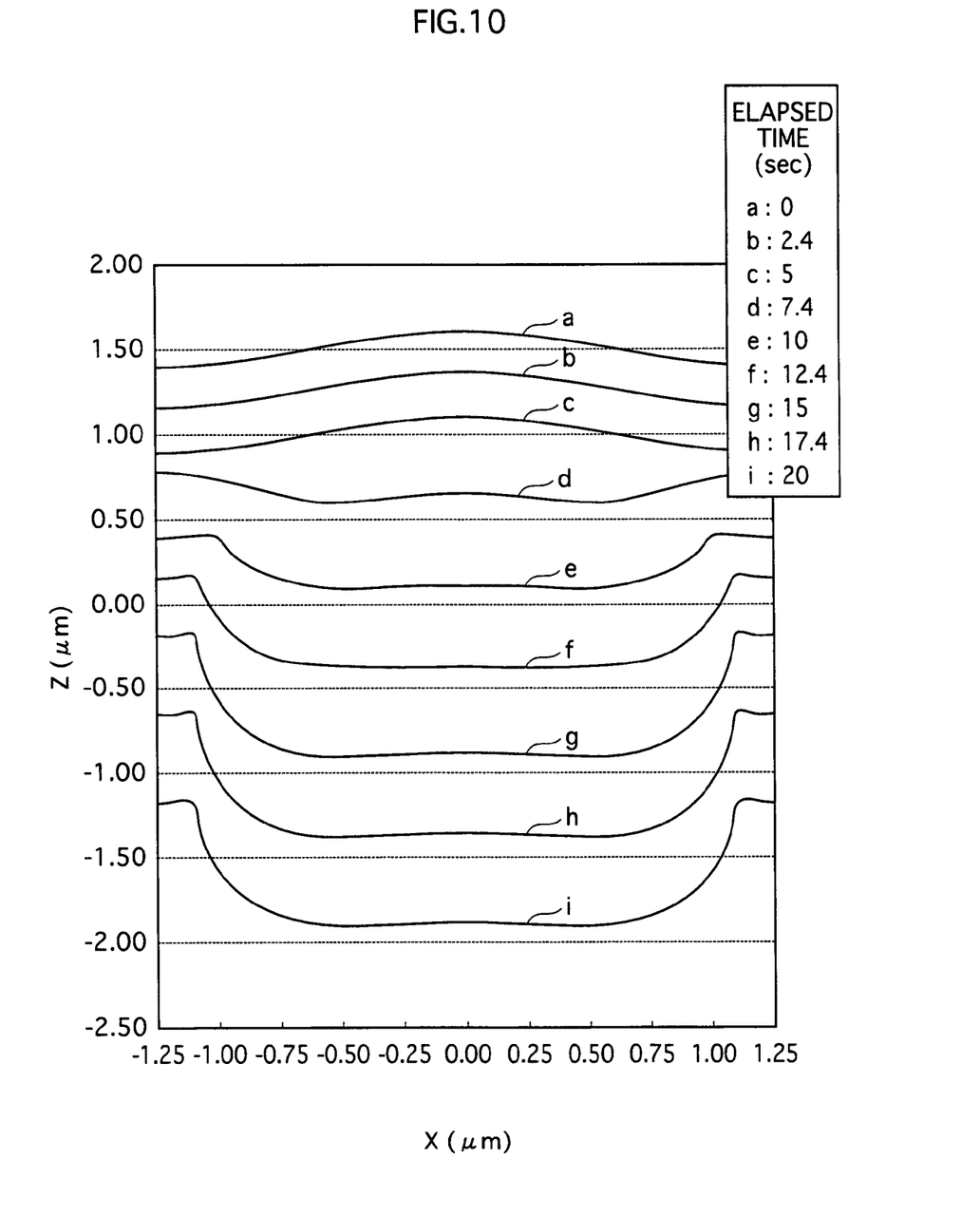
FIG. 10 is a characteristics diagram showing transition of a shape of a surface of the embedding resist film 52a during the etch-back conducted on the embedding resist film 52a shown in FIG. 9.

The following describes a relation between the shape of the depression 19a to be formed and the flatness of the surfaces 51f and 52f of the embedding resist films 51 and 52, with reference to FIG. 9 and FIG. 10.

As FIG. 9 shows, it is assumed here that the surface 52f of the embedding resist film 51 is not strictly flattened. Specifically, it is assumed that a part 52a of the surface 52f swells along the pattern resist film 50. If etch-back is conducted in such a case, even the etching has progressed (from the line (a) to the line (i) in FIG. 10) as FIG. 10 shows, the swell remains in the central part of the depression 19a. For the formation of the in-layer lens 20a, irregular shapes like such a swell is not preferable.

On the contrary, with the manufacturing method for the solid-state imaging apparatus according to the embodiment, irregular shapes can be prevented as FIG. 6 shows, because the surface 51f of the embedding resist film 51 is flattened.

8. Other Issues

The above-described manufacturing method of the solid-state imaging apparatus 1 according to the embodiment is an example of the present invention. Therefore, the present invention is not limited to the embodiment, except for the most characteristic part thereof. For example, the present invention is not limited to the method for manufacturing the in-layer lens 20a of the solid-state imaging apparatus 1, and it is applicable to form a micro lens of a display apparatus, such as an LCD (Liquid Crystal Display). The present invention is also applicable to form a lens of an LED (Light-Emitting Diode)

In the above-described embodiment, the pattern resist film 50 is formed by the CVD method, or the pattern formation method such as the photoresisting, the lithography and the resist baking. However, the following methods are also applicable.

In the above-described embodiment, the pattern resist film may be formed by firstly forming a film with use of a photosensitive material, covering the formed film with a mask having a prescribed opening, and then exposing and developing the film. Alternatively, the pattern resist film may be formed by firstly, with use of a photosensitive material, forming a pattern resist preparation film that has been subjected to the patterning by the lithography method on the interlayer lens first preparation film 190, and then flowing the formed film by applying heat at 150° C. or higher.

In the above-described embodiment, the following variations for forming the embedding resist film may also be adopted. For example, the embedding resist film with a flattened surface may be formed by applying viscous fluid material with hardenability (e.g. resin material) the in-layer lens first preparation film 190 on which the pattern resist film 50 is formed, and hardening the viscous fluid material. Here, if a resin material is used as a constituent of both the pattern resist film and the embedding resist film, it is preferable that the double bond density of the resin material for the pattern resist film is higher than the double bond density of the resin material for the embedding resist film.

In the above-described embodiment, the depression 19a may be formed by the dry etching using a mixture gas including a fluorine gas, using silicon nitride or silicon nitroxide as a constituent of the pattern resist film, and silicon oxide as a constituent of the embedding resist film.

In the above-described embodiment, the charge-transfer type solid-state imaging apparatus is taken as an example. However, it is possible to form a micro lens with high light concentration efficiency by applying the present invention to a MOS-type solid-state imaging apparatus.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A method for forming an on-chip lens, comprising:
a depositing step of depositing a base film on a surface of a substrate, the base film being translucent and made of a first material; and
a digging step of digging a depression in a portion of the base film, wherein
the digging step includes
a depositing substep of depositing a pattern film on a surface of the base film, the pattern film being made of a second material and in an inverted shape of the depression,
a forming substep of forming an embedding film to flatten the surface of the pattern film, the embedding film being made of a third material and embedding therein the pattern film, and
an etch-back substep of conducting etch-back on a surface of the embedding film toward the base film to dig the depression, and
an etch rate of the second material is higher than an etch rate of the third material.

2. The method of claim 1, wherein
an etch rate ratio of the second material to the third material is from 1.5 to 2.5 inclusive.

3. The method of claim 1, wherein
an etch rate ratio of the third material to the first material is from 0.5 to 1.5 inclusive.

4. The method of claim 1, wherein
an etch rate ratio of the second material to the first material is from 1.5 to 2.5 inclusive.

5. The method of claim 1, wherein
in the depositing substep of depositing the pattern film,
a photosensitive resin is used as the second material,
a film made of the photosensitive resin is formed on the base film,
a mask having a prescribed opening is formed on the film made of the photosensitive resin, and
the film made of the photosensitive resin is exposed and developed from above the mask to form the pattern film.

6. The method of claim 1, wherein
in the forming substep of forming the embedding film,
a viscous fluid material with hardenability is used as the third material, and
the viscous fluid material is applied on the pattern film formed on the base film to form the embedding film.

7. The method of claim 1, wherein
in the depositing substep of depositing the pattern film and the forming substep of forming the embedding film,
a synthetic resin is used as the second material and the third material, and
a double bond density of the second material is higher than a double bond density of the third material.

8. The method of claim 1, wherein
in the depositing substep of depositing the pattern film,
silicon nitride or silicon nitroxide is used as the second material, and
in the forming substep of forming the embedding film,
the etch-back is conducted by dry etching using a gas including fluorine.

9. The method of claim 1, wherein further comprising
a filling step of filling a fourth material in the depression formed in the digging step of digging the depression, the fourth material being translucent and having a refractive index different from a refractive index of the first material.

10. A method for manufacturing a solid-state imaging apparatus, comprising, for forming an in-layer lens, of:

a depositing step of depositing a base film on a surface of a substrate, the base film being translucent and made of a first material; and a digging step of digging a depression in a portion of the base film, wherein the digging step includes a depositing substep of depositing a pattern film on a surface of the base film, the pattern film being made of a second material and in an inverted shape of the depression, a forming substep of forming an embedding film to flatten the surface of the pattern film, the embedding film being made of a third material and embedding therein the pattern film, and an etch-back substep of conducting etch-back on a surface of the embedding film toward the base film to dig the depression, and an etch rate of the second material is higher than an etch rate of the third material.

11. The method of claim 10, wherein
an etch rate ratio of the second material to the third material is from 1.5 to 2.5 inclusive.

12. The method of claim 10, wherein
an etch rate ratio of the third material to the first material is from 0.5 to 1.5 inclusive.

13. The method of claim 10, wherein
an etch rate ratio of the second material to the first material is from 1.5 to 2.5 inclusive.

14. The method of claim 10, wherein
in the depositing substep of depositing the pattern film,
a photosensitive resin is used as the second material,
a film made of the photosensitive resin is formed on the base film,
a mask having a prescribed opening is formed on the film made of the photosensitive resin, and
the film made of the photosensitive resin is exposed and developed from above the mask to form the pattern film.

15. The method of claim 10, wherein
in the forming substep of forming the embedding film,
a viscous fluid material with hardenability is used as the third material, and
the viscous fluid material is applied on the pattern film formed on the base film to form the embedding film.

16. The method of claim 10, wherein
in the depositing substep of depositing the pattern film and the forming substep of forming the embedding film,
a synthetic resin is used as the second material and the third material, and
a double bond density of the second material is higher than a double bond density of the third material.

17. The method of claim 10, wherein
in the depositing substep of depositing the pattern film,
silicon nitride or silicon nitroxide is used as the second material, and
in the forming substep of forming the embedding film,
the etch-back is conducted by dry etching using a gas including fluorine.

18. The method of claim 10, wherein
a filling step of filling a fourth material in the depression formed in the digging step of digging the depression, the fourth material being translucent and having a refractive index different from a refractive index of the first material.

* * * * *